United States Patent
Xiao et al.

(10) Patent No.: US 8,890,599 B1
(45) Date of Patent: Nov. 18, 2014

(54) INTRINSIC COMPARATOR DELAY FOR OUTPUT CLAMPING CIRCUIT

(71) Applicant: Texas Instruments Incorporated, Dallas, TX (US)

(72) Inventors: Ming Xiao, Shenzhen (CN); Jian Wang, Shenzhen (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/098,142

(22) Filed: Dec. 5, 2013

Related U.S. Application Data

(63) Continuation-in-part of application No. PCT/CN2013/083109, filed on Sep. 9, 2013.

(51) Int. Cl.
*H03K 5/08* (2006.01)

(52) U.S. Cl.
CPC ........................................ *H03K 5/08* (2013.01)
USPC .............................. 327/321; 327/87; 327/312

(58) Field of Classification Search
USPC ......... 327/77, 85, 87, 89, 310, 312, 313, 318, 327/321, 323, 327, 328
See application file for complete search history.

(56) References Cited

U.S. PATENT DOCUMENTS

| | | | |
|---|---|---|---|
| 6,542,010 B2 * | 4/2003 | Einfeldt | 327/78 |
| 6,633,193 B1 * | 10/2003 | Halamik et al. | 327/334 |
| 6,897,703 B2 * | 5/2005 | Hunt | 327/313 |
| 2014/0197807 A1 * | 7/2014 | Tercariol et al. | 323/234 |

* cited by examiner

*Primary Examiner* — William Hernandez
(74) *Attorney, Agent, or Firm* — William B. Kempler; Frederick J. Telecky, Jr.

(57) ABSTRACT

A circuit includes a comparator to generate a clamp output signal by monitoring an output voltage and a reference voltage that sets a clamp voltage threshold for the output voltage. The clamp output signal is employed to limit an input voltage from exceeding the clamp voltage threshold. A first switch supplies the reference voltage to the comparator. The first switch forms a portion of an intrinsic delay circuit with a first feedback path in the comparator to mitigate ripple in the output voltage. A second switch is coupled to the input voltage and a second feedback path in the comparator. The second switch forms another portion of the intrinsic delay circuit with the first switch, the first feedback path, and the second feedback path in the comparator to further mitigate ripple in the output voltage.

20 Claims, 6 Drawing Sheets

INTRINSIC COMPARATOR DELAY FOR OUTPUT CLAMPING CIRCUIT

RELATED APPLICATION

This application is a continuation-in-part of PCT Patent Application Serial No. PCT/CN2013/083109, filed 9 Sep. 2013, which is incorporated herein in its entirety.

TECHNICAL FIELD

This disclosure relates to voltage protection circuits, and more particularly to a protection circuit that employs a comparator intrinsic delay circuit and single reference input to improve clamping circuit performance.

BACKGROUND

An overvoltage protection circuit is a circuit which protects electronics from excessive voltage which could potentially damage or destroy electronic components. Over voltage protection circuits typically protect downstream circuitry from damage due to detected excessive voltage. One common application for overvoltage protection is in a mobile device such as a cell phone or personal computer. When such mobile devices are connected to a power source, large transient voltages are often generated at the instant power is applied to the device. In addition to transients, sometimes devices can be connected to improper power sources where the voltage output of the power source exceeds the input requirements of the mobile device. In either overvoltage scenario, overvoltage protection circuits inside the mobile devices can engage when an overvoltage condition is detected in order to limit the voltage to the device.

Typical overvoltage protection circuits attempt to clamp the output voltage from the power source to a predetermined voltage level that can be defined by a reference voltage input to the protection circuit. In some conventional overvoltage clamping circuits, multiple reference voltages are employed at the input to the clamping circuits in an attempt to provide hysteresis in the circuit and hence tailor the response of the clamping circuit. Such attempts utilizing multiple reference voltages typically led to an undesirable amount of ripple voltage at the output of the protection circuit.

SUMMARY

This disclosure relates to voltage clamping circuits. In one example, a circuit includes a comparator to generate a clamp output signal by monitoring an output voltage and a reference voltage that sets a clamp voltage threshold for the output voltage. The clamp output signal is employed to limit an input voltage from exceeding the clamp voltage threshold. A first switch supplies the reference voltage to the comparator. The first switch forms a portion of an intrinsic delay circuit with a first feedback path in the comparator to mitigate ripple in the output voltage. A second switch is coupled to the input voltage and a second feedback path in the comparator. The second switch forms another portion of the intrinsic delay circuit with the first switch, the first feedback path, and the second feedback path in the comparator to further mitigate ripple in the output voltage.

In another example, a circuit includes a comparator to generate a clamp output signal by monitoring an output voltage and a reference voltage that sets a clamp voltage threshold for the output voltage. The clamp output signal is employed to limit an input voltage from exceeding the clamp voltage threshold. A first switch supplies the reference voltage to the comparator and includes a first drain connected to the reference voltage. The first switch includes a first source coupled to a first differential input of the comparator and a first gate that receives a first feedback signal from a first output of the comparator. The first gate enables the first switch to supply the reference voltage to the first differential input of the comparator. A second switch operates with the first switch and includes a second drain coupled to the input voltage. The second switch includes a second source coupled to the first source of the first switch and to the first differential input of the comparator. The second switch includes a second gate that receives a second feedback signal from a second output of the comparator. The first switch, the first feedback signal, the second switch, and the second feedback signal form an intrinsic delay circuit in the comparator to mitigate ripple in the output voltage.

In yet another example, a system includes a mobile device and a protection circuit to limit an input voltage to the mobile device. The protection circuit includes a power switching circuit to supply the input voltage to the mobile device in response to a gate control signal. A gate control circuit generates the gate control signal in response to a clamp output signal. A comparator generates the clamp output signal by monitoring an output voltage to the mobile device and a reference voltage that sets a clamp voltage threshold for the output voltage. The clamp output signal is employed to limit the input voltage from exceeding the clamp voltage threshold. A first switch supplies the reference voltage to the comparator. The first switch forms a portion of an intrinsic delay circuit with a first feedback path in the comparator to mitigate ripple in the output voltage. A second switch is coupled to the input voltage and a second feedback path in the comparator, the second switch forms another portion of the intrinsic delay circuit with the first switch, the first feedback path, and the second feedback path in the comparator to further mitigate ripple in the output voltage.

DETAILED DESCRIPTION

A protection circuit is provided that mitigates output ripple voltage supplied to a device. The protection circuit receives an input voltage and generates a regulated output voltage that limits input overvoltage to the device via a clamping circuit. The clamping circuit includes a comparator that utilizes a single reference input as a voltage limiting threshold and exploits an intrinsic delay circuit in the comparator to provide stable switching operations in the comparator while mitigating output voltage ripple to the device. In contrast to multiple reference input designs that provide a window of hysteresis between the multiple reference inputs that in turn cause higher output ripple, the single reference input and intrinsic delay architecture enables efficient switching operations in the comparator while promoting stable operations over temperature and load. The intrinsic delay circuit also provides a single pole architecture. The single pole operation facilitates clamping circuit stability with lower circuit complexity over changes in temperature and load.

Figure 1:
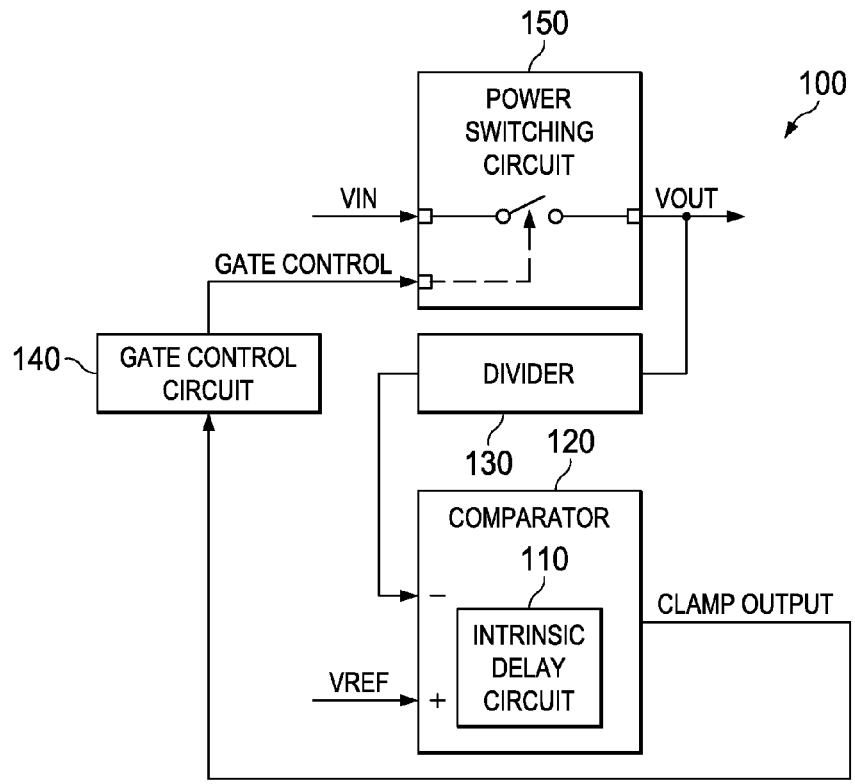
FIG. 1 illustrates an example of a protection circuit to clamp an input voltage at a predetermined output voltage level via an intrinsic delay circuit in a comparator.

FIG. 1 illustrates an example of a protection circuit 100 to clamp an input voltage (VIN) at a predetermined output voltage (VOUT) level via an intrinsic delay circuit 110 in a comparator 120. The protection circuit 100 is provided to limit voltages to mobile devices (e.g., cell phone, computer) that may be connected to a power source (e.g., AC/DC adapter, DC/DC Adapter, USB port), where the protection circuit limits over-voltages from the power source supplying VIN to the device which receives VOUT. Such over-voltages can be generated as transients when connecting the mobile device to the power source or could potentially be from connecting an incorrect source to a device. In either case, the protection circuit 100 limits over-voltages to the device by clamping the input voltage VIN to a predetermined level at VOUT which supplies the device.

The comparator 120 generates a clamp output signal by monitoring the output voltage VOUT via a voltage divider 130. A reference voltage (VREF) sets a clamp voltage threshold for the output voltage in the protection circuit 100. The clamp output signal is employed to limit the input voltage VIN from exceeding the clamp voltage threshold set by VREF. The clamp output signal drives a gate control circuit 140 which enables or disables a power switching circuit 150 via a gate control signal. When the power switching circuit 150 is enabled via the gate control circuit 140 and clamp output signal command, the input voltage VIN is passed to the output VOUT. When the power switching circuit 150 is disabled via the gate control circuit 140 and clamp output signal command, the input voltage VIN is disconnected from the output VOUT.

As long as the input voltage VIN which is sensed on the minus input of the comparator 120 does not exceed the output voltage limiting threshold set by VREF at the positive input of the comparator, then the clamp output signal from the comparator commands the gate control circuit 140 to enable the power switching circuit 150 to pass VIN to VOUT. If VIN at the minus input of the comparator 120 is detected above VREF at the positive input of the comparator, then the clamp output signal switches and commands the gate control circuit 140 to deactivate VIN from appearing at VOUT via the gate control signal and the power switching circuit 150. As the power switching circuit 150 is activated and deactivated via the gate control circuit 140, this causes a ripple voltage to appear at VOUT where VOUT will raise in voltage when the power switching circuit is activated and decrease in voltage (due to load) when the power switching circuit is deactivated.

Figure 2:
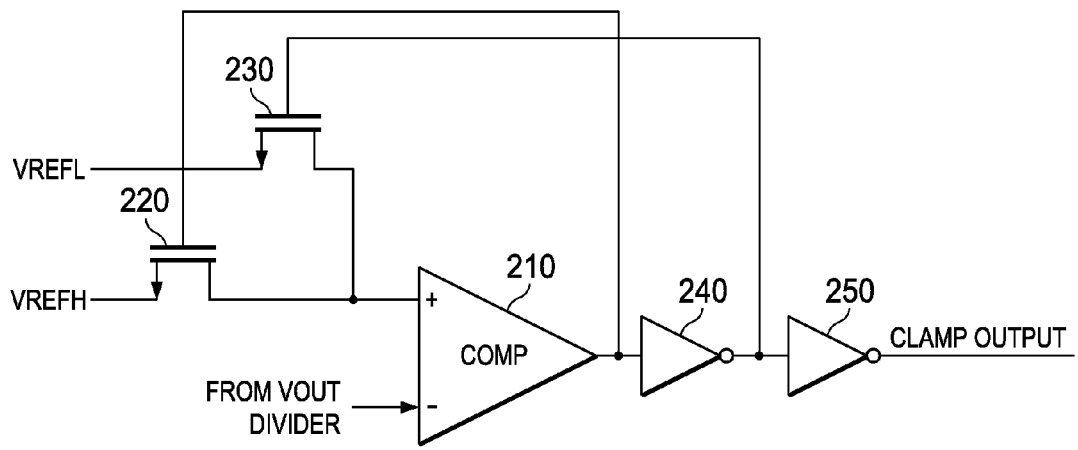
FIG. 2 illustrates a prior art clamp comparator that employs two reference voltage inputs to form a hysteresis in the comparator.
Figure 3:
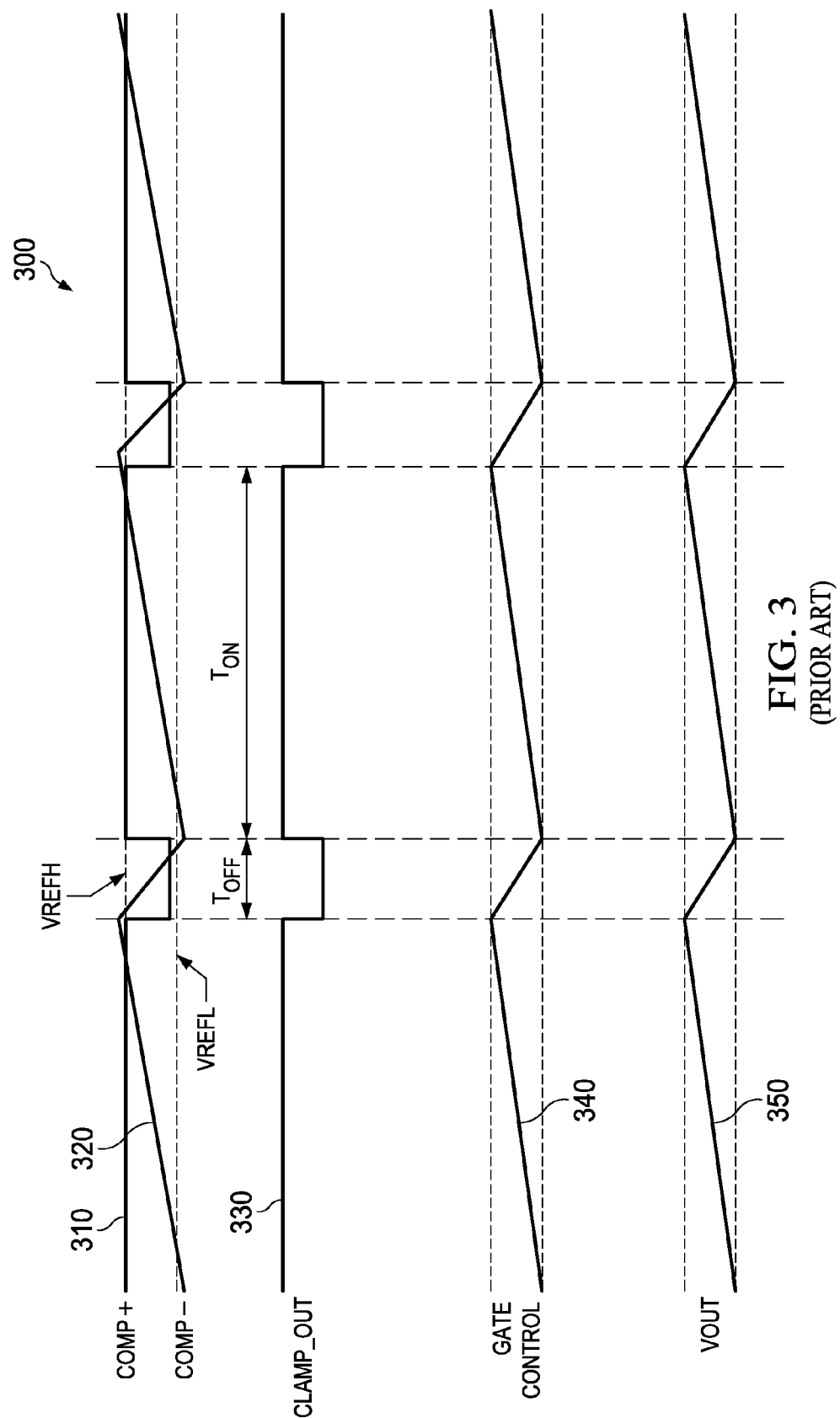
FIG. 3 illustrates a prior art signal diagram for the prior art clamp comparator of FIG. 2.

By utilizing the single reference input VREF in conjunction with the intrinsic delay circuit 110 of the comparator 120, such output ripple voltage is mitigated over multiple reference input systems which are now briefly described with respect to prior art FIGS. 2 and 3. FIG. 2 illustrates a prior art clamp comparator 210 that employs two reference voltage inputs VREFH and VREFL to form hysteresis in the comparator. The inputs VREFH and VREFL are fed through transistors 220 and 230 whose outputs are tied at the positive input of the comparator 210. Feedback from the output of the comparator 210 drives transistor 220 whereas an inverted output from inverter 240 drives transistor 230. A second inverter 250 provides an additional path delay before the clamp output signal is generated. As shown, the minus input to the comparator 210 receives a sampled VOUT from a voltage divider (not shown).

As VOUT rises on the minus input, it will continue to rise until it reaches an upper threshold set by VREF high. At that point, the clamp output will switch causing the positive input to change via feedback from inverter 240. This also causes the input voltage to drop since the clamp output signal deactivates a gate which switches off VIN. The input voltage appearing as VOUT will then have a ripple value that operates in a hysteresis window between the two reference inputs set by VREFH and VREFL. As will be illustrated and described below with respect to FIG. 4, a single reference voltage and an intrinsic delay circuit are employed to mitigate such ripple. FIG. 3 illustrates a prior art signal diagram 300 for the prior art clamp comparator 210 of FIG. 2 showing how ripple voltages are generated via the comparator 210 having multiple reference inputs VREFH and VREFL. The signals VREFH and VREFL are illustrated as dotted lines on the diagram 300. A top waveform 310 shows the signal generated at the plus input of the comparator. A waveform 320 shows the minus input of the comparator which is a sample of VOUT from a divider circuit. As shown, the sampled VOUT signal 320 at the minus input rises and then falls as output voltages rise and then when thresholds are reached. A signal 330 depicts the clamp output signal from the comparator. A signal 340 depicts a gate control signal and signal 350 depicts the VOUT signal having ripple which is supplied to the device. As will be shown in the signal diagram of FIG. 6, the output ripple is substantially decreased when using the single reference architecture and intrinsic delay circuit described in FIG. 1.

Figure 4:
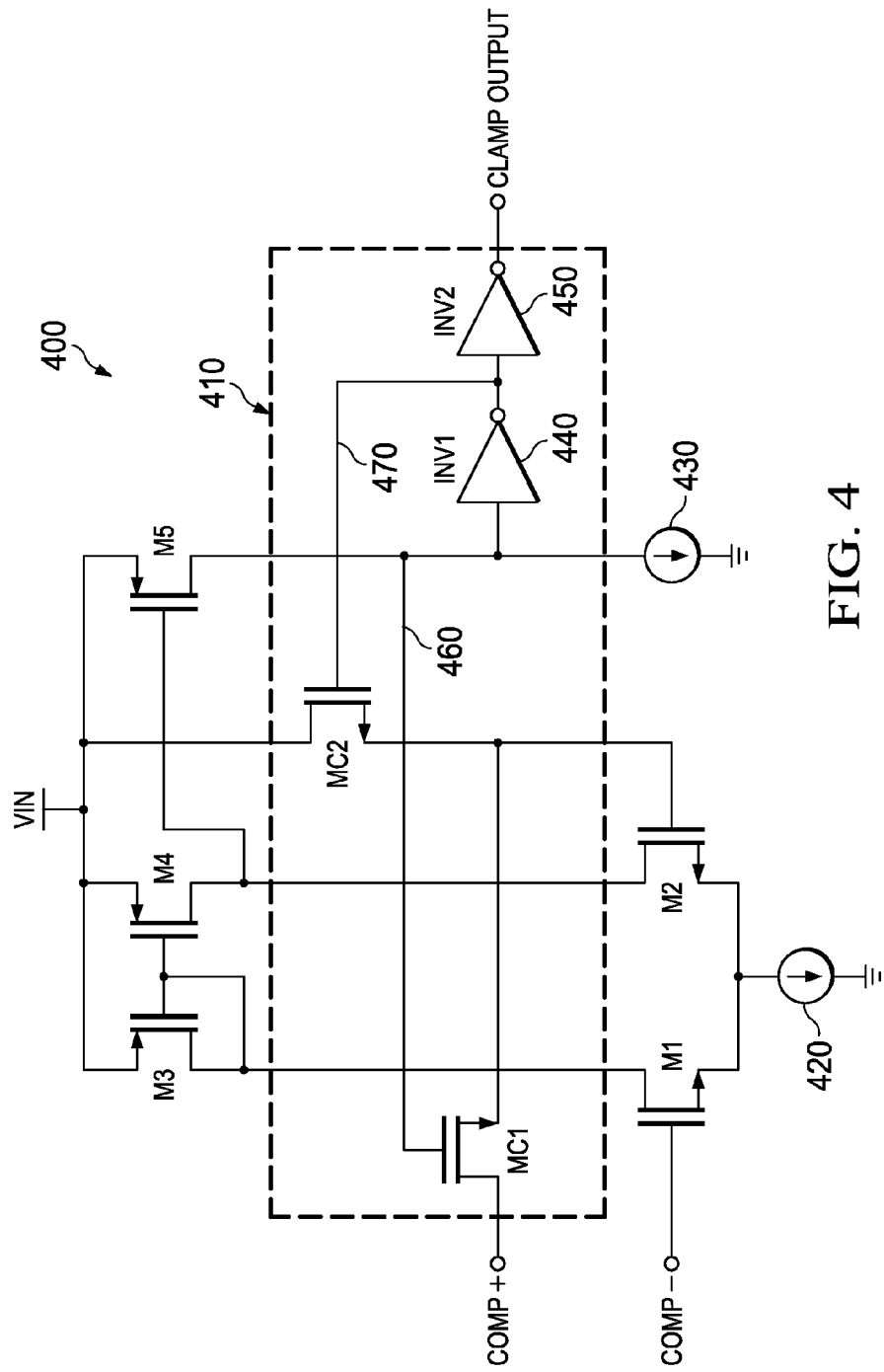
FIG. 4 illustrates an example of a clamp comparator that employs a single reference voltage input and an intrinsic delay circuit to mitigate output ripple in a protection circuit.

Referring back to FIG. 1, a brief description of the intrinsic delay circuit 110 is provided before a more detailed discussion in FIG. 4. The intrinsic delay circuit 110 includes a first switch to supply the reference voltage VREF to the comparator 120. The first switch forms a portion of the intrinsic delay circuit with a first feedback path in the comparator to mitigate ripple in the output voltage. The intrinsic delay circuit 110 also includes a second switch coupled to the input voltage VIN and a second feedback path in the comparator. The second switch forms another portion of the intrinsic delay circuit 110 with the first switch, the first feedback path, and the second feedback path in the comparator 120 to further mitigate ripple in the output voltage.

In one example, the circuit 100 can be provided as a circuit (e.g., integrated circuit, discrete circuit, combination of integrated circuit and discrete circuits) for protecting devices. Discrete control elements can be provided within the various circuits, for example. It is noted that the examples described herein can be provided via different analog and/or digital circuit implementations. For instance, in some cases, field effect transistors can be employed and in other cases junction transistors or diodes employed. The circuit 100 can employ various means of monitoring electrical parameters such as monitoring voltage and/or current. This can also include generating voltage and/or current control signals as described herein.

FIG. 4 illustrates an example of a clamp comparator 400 that employs a single reference voltage input and an intrinsic delay circuit 410 to mitigate output ripple in a protection circuit. The comparator 400 generates a clamp output signal by monitoring an output voltage at a comparator minus input (COMP−) and a reference voltage at a comparator positive input (COMP+) that sets a clamp voltage threshold for the output voltage. The comparator 400 includes a differential amplifier consisting of transistors M1 and M2 which are driven from transistors M3 and M4 which are in turn connected to the supply VIN. The differential amplifier of M1 and M2 are connected at a common source point to a current source 420. A transistor M5 is driven from the drains of M2 and M4 and connected at its source to VIN. A current source is coupled to M5 which also drives an inverter 440 which in turn drives a second inverter 450 which supplies the clamp output signal. The clamp output signal is employed to limit the input voltage VIN (See FIG. 5 for gate control and power switching) from exceeding the clamp voltage threshold set at the COMP+input.

The intrinsic delay circuit 410 includes a first switch MC1 to supply the reference voltage at COMP+ to the comparator. The first switch MC1 includes a first drain connected to the reference voltage at COMP+ and a first source coupled to a first differential input of the comparator at the gate of M2. A first gate of MC1 receives a first feedback signal 460 from a first output of the comparator 400, where the first gate enables the first switch MC1 to supply the reference voltage to the first differential input of the comparator 400 at the gate of M2. The intrinsic delay circuit 410 includes a second switch MC2 that operates with the first switch MC1. The second switch MC2 includes a second drain coupled to the input voltage VIN and a second source coupled to the first source of the first switch MC1 and to the first differential input of the comparator at the gate of M1. The gate of MC2 is the second gate of the intrinsic delay circuit 410 that receives a second feedback signal 470 from a second output of the comparator 400. The first switch MC1, the first feedback signal 460, the second switch MC2, and the second feedback signal 470 form an intrinsic delay circuit in the comparator 400 to mitigate ripple in the output voltage. A protection circuit depicted in FIG. 5 will illustrate how the comparator 400 and intrinsic delay circuit 410 is utilized to clamp input voltages to desired output voltage levels set by a single voltage reference to mitigate output ripple voltage.

Figure 5:
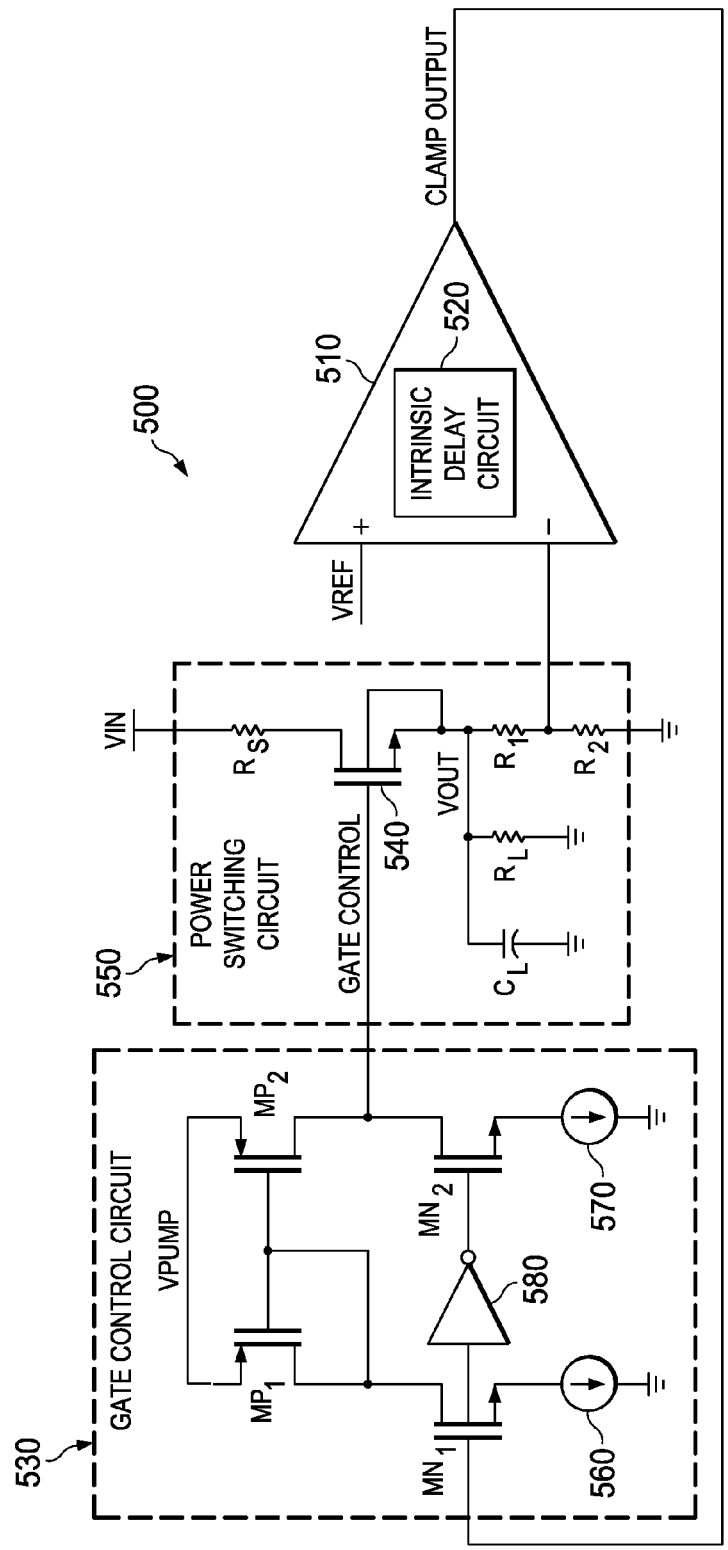
FIG. 5 illustrates an example of a protection circuit having a clamp comparator that employs a single reference voltage input and an intrinsic delay circuit to mitigate output ripple in the protection circuit.

FIG. 5 illustrates an example of a protection circuit 500 having a clamp comparator 510 that employs a single reference voltage input (VREF) and an intrinsic delay circuit 520 to mitigate output ripple in the protection circuit. The clamp comparator 510 generates a clamp output signal that drives a gate control circuit 530. A gate control signal from the gate control circuit 530 controls a power switch 540 in a power switching circuit 550. The power switching circuit receives VIN that is coupled through a series resistor Rs to the power switch 540. Output of the power switch is the regulated output voltage VOUT of the protection circuit 500. A resistor RL and capacitor CL represent an output load and also can operate as a filter for VOUT. A voltage divider consisting of R1 and R2 provide a sample of VOUT to a minus input to the comparator 510. Thus, VOUT rises until crossing a threshold set by VREF at the positive input of the comparator 510.

At the threshold point, the clamp output signal switches which causes the gate control circuit 530 to deactivate the gate control signal which deactivates the power switch 540 which in turn disconnects VIN from appearing at VOUT. When VOUT as sensed by the voltage divider of R1 and R2 falls below the threshold set by VREF, the clamp output signal switches and subsequently enables VIN to be switched to VOUT via the gate control signal and the power switch 540. As shown, the gate control circuit 530 can include pump transistors MP1 and MP2 which are connected to a pump voltage source which can be a derived from VIN. Transistors MP1 and MP2 drive transistors MN1 and MN2 which are connected to current sources 560 and 570, respectively. An inverter 580 inverts the clamp output signal at the gate input of MN2. The VOUT output ripple is generally depends on current sources 570 and the comparator intrinsic delay time TOFF.

Figure 6:
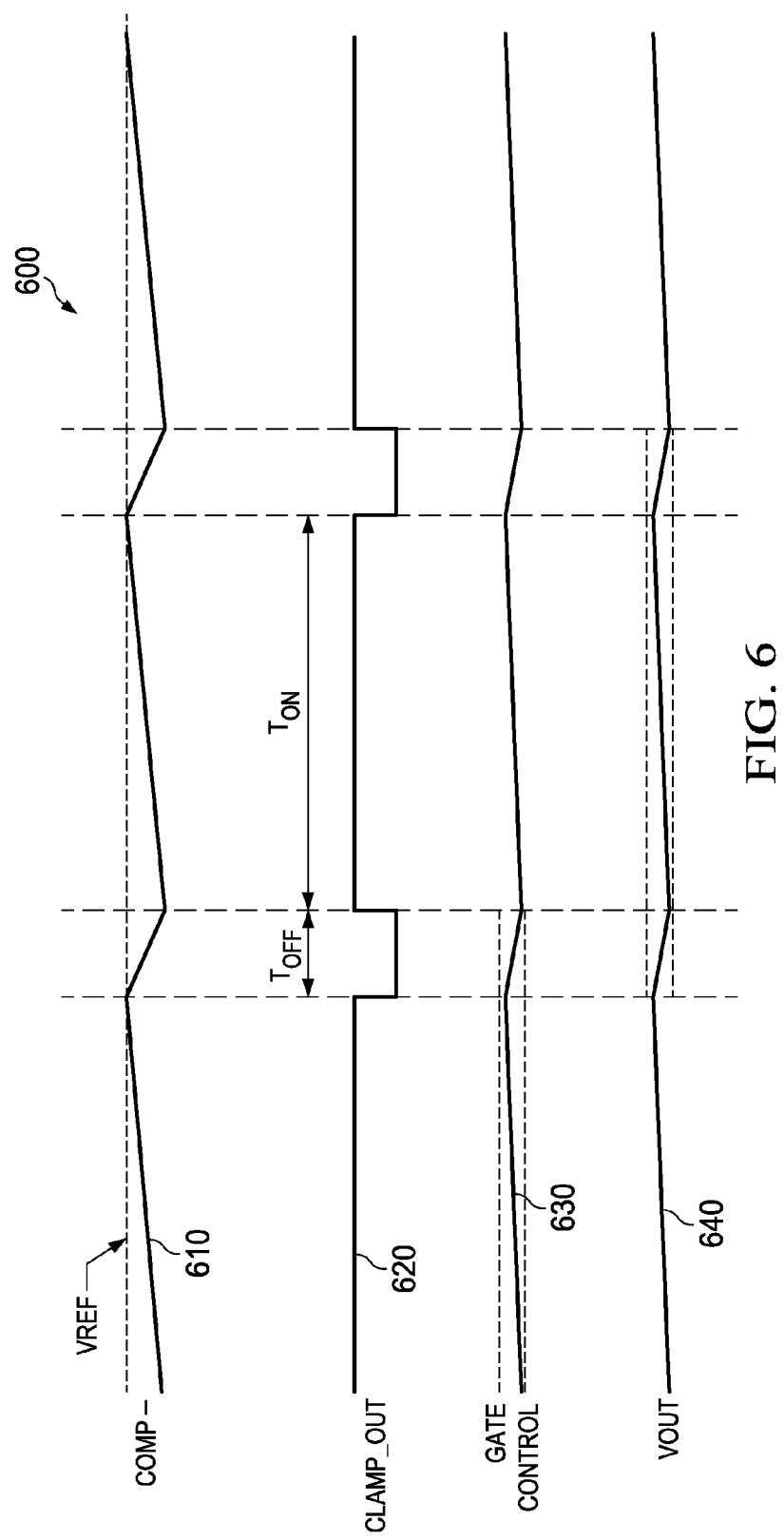
FIG. 6 illustrates a example signal diagram for the protection circuit of FIG. 5.

FIG. 6 illustrates a example signal diagram 600 for the protection circuit 500 of FIG. 5. A waveform 610 represents a sampled VOUT signal that appears at the minus input (COMP−) of the comparator 510 depicted in FIG. 5. The input VREF is fed to the other input of the comparator (COMP+) which sets a limiting threshold for the magnitude of VOUT. A signal 620 shows the clamp output signal and shows a transition to TOFF when the COMP−input reaches VREF. The TOFF is the comparator intrinsic delay time, determined by the comparator architecture and input voltage. A gate control signal 620 is controlled from the clamp output signal whereas the output VOUT at 630. The single reference input and intrinsic delay circuit 520 shown in FIG. 5 causes the output ripple appearing in VOUT to mitigated from the ripple shown in prior art FIG. 3.

Figure 7:
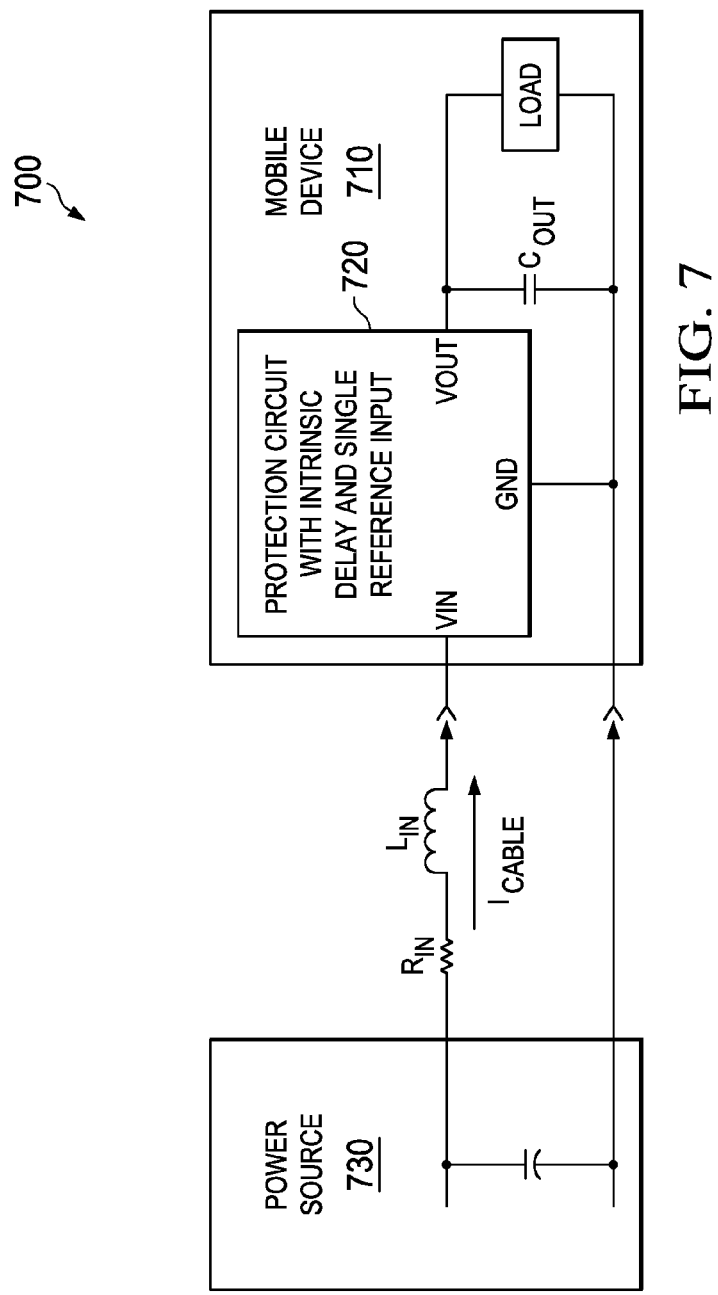
FIG. 7 illustrates a system example of a mobile device that employs a protection circuit having a clamp comparator that employs a single reference voltage input and an intrinsic delay circuit to mitigate output ripple in the protection circuit.

FIG. 7 illustrates an example system 700 of a mobile device 710 that employs a protection circuit 720 having a clamp comparator that employs a single reference voltage input and an intrinsic delay circuit to mitigate output ripple in the protection circuit. An input voltage VIN is received by the protection circuit 720 from a power source 730. The power source 730 can include an AC source (e.g., AC/DC adapter), a DC source (DC/DC adapter), or power from a computer input such as from a USB port, for example. Coupling resistance Rin and inductance Lin are modeled from the source 730 to the mobile device 710. The mobile device 710 can be substantially any device such as cell phone, mobile computer, or other device, for example. The protection circuit 720 receives VIN and provides a regulated VOUT to a load in the device 710 which can also include some capacitance modeled as Cout. As shown above with respect to FIGS. 5 and 6, the protection circuit 720 provides a reduced ripple output voltage VOUT to the mobile device 710 while also limiting the magnitude of VIN to the device. Such ripple is mitigated over prior art systems such as shown in FIG. 3 that employ multiple reference inputs to supply hysteresis within the protection circuit.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   a comparator to generate a clamp output signal by monitoring an output voltage and a reference voltage that sets a clamp voltage threshold for the output voltage, wherein the clamp output signal is employed to limit an input voltage from exceeding the clamp voltage threshold;
a first switch to supply the reference voltage to the comparator, the first switch forms a portion of an intrinsic delay circuit with a first feedback path in the comparator to mitigate ripple in the output voltage; and
a second switch coupled to the input voltage and a second feedback path in the comparator, the second switch forms another portion of the intrinsic delay circuit with the first switch, the first feedback path, and the second feedback path in the comparator to further mitigate ripple in the output voltage.

2. The circuit of claim 1, further comprising a power switching circuit to switch the input voltage to the output voltage in response to a gate control signal.

3. The circuit of claim 2, the power switching circuit further comprising a power transistor that switches the input voltage to the output voltage in response to the gate control signal.

4. The circuit of claim 3, the power switching circuit further comprising a filter to filter the output voltage supplied to a mobile device.

5. The circuit of claim 4, the power switching circuit further comprising a voltage divider to monitor the output voltage supplied to the comparator.

6. The circuit of claim 2, further comprising a gate control circuit to generate the gate control signal in response to the clamp output signal.

7. The circuit of claim 6, the gate control circuit further comprising a pair of gate control transistors that are supplied by a pair of current sources to generate the gate control signal.

8. The circuit of claim 7, wherein the gate control circuit further comprising a pair of pump transistors to drive the pair of gate control transistors to generate the gate control signal.

9. The circuit of claim 1, the comparator further comprising a pair of differential transistors that form a differential input amplifier having at least one input coupled to the first switch and the second switch.

10. The circuit of claim 9, the comparator further comprising at least one inverter at the output of the comparator to provide a delay path in the intrinsic delay circuit.

11. A circuit comprising:
a comparator to generate a clamp output signal by monitoring an output voltage and a reference voltage that sets a clamp voltage threshold for the output voltage, wherein the clamp output signal is employed to limit an input voltage from exceeding the clamp voltage threshold;
a first switch to supply the reference voltage to the comparator, the first switch comprising:
a first drain connected to the reference voltage;
a first source coupled to a first differential input of the comparator; and
a first gate that receives a first feedback signal from a first output of the comparator, the first gate enabling the first switch to supply the reference voltage to the first differential input of the comparator, and
a second switch that operates with the first switch, the second switch comprising:
a second drain coupled to the input voltage;
a second source coupled to the first source of the first switch and to the first differential input of the comparator; and
a second gate that receives a second feedback signal from a second output of the comparator, wherein the first switch, the first feedback signal,
the second switch, and the second feedback signal form an intrinsic delay circuit in the comparator to mitigate ripple in the output voltage.

12. The circuit of claim 11, the comparator further comprising a pair of differential transistors that form a differential input amplifier having at least one input coupled to the first gate of the first switch and the second gate of the second switch.

13. The circuit of claim 12, the comparator further comprising at least one inverter at the output of the comparator to provide a delay path in the intrinsic delay circuit.

14. The circuit of claim 11, further comprising a power switching circuit to switch the input voltage to the output voltage in response to a gate control signal.

15. The circuit of claim 14, the power switching circuit further comprising a power transistor that switches the input voltage to the output voltage in response to the gate control signal.

16. The circuit of claim 14, further comprising a gate control circuit to generate the gate control signal in response to the clamp output signal.

17. The circuit of claim 16, the gate control circuit further comprising a pair of gate control transistors that are supplied by a pair of current sources to generate the gate control signal.

18. A system comprising:
a mobile device; and
a protection circuit to limit an input voltage to the mobile device, the protection circuit comprising:
a power switching circuit to supply the input voltage to the mobile device in response to a gate control signal;
a gate control circuit to generate the gate control signal in response to a clamp output signal;
a comparator to generate the clamp output signal by monitoring an output voltage to the mobile device and a reference voltage that sets a clamp voltage threshold for the output voltage, wherein the clamp output signal is employed to limit the input voltage from exceeding the clamp voltage threshold;
a first switch to supply the reference voltage to the comparator, the first switch forms a portion of an intrinsic delay circuit with a first feedback path in the comparator to mitigate ripple in the output voltage; and
a second switch coupled to the input voltage and a second feedback path in the comparator, the second switch forms another portion of the intrinsic delay circuit with the first switch, the first feedback path, and the second feedback path in the comparator to further mitigate ripple in the output voltage.

19. The system of claim 18, the comparator further comprising a pair of differential transistors that form a differential input amplifier having at least one input coupled to the first switch and the second switch.

20. The system of claim 19, the comparator further comprising at least one inverter at the output of the comparator to provide a delay path in the intrinsic delay circuit.

* * * * *